(12) United States Patent
Luan et al.

(10) Patent No.: US 11,164,951 B2
(45) Date of Patent: Nov. 2, 2021

(54) THIN FILM TRANSISTOR AND MANUFACTURING METHOD THEREOF AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Mengyu Luan, Beijing (CN); Yuching Peng, Beijing (CN); Fei Li, Beijing (CN); Lin Chen, Beijing (CN); Youyuan Hu, Beijing (CN); Huihui Li, Beijing (CN); Xinfeng Wu, Beijing (CN); Xinzhu Wang, Beijing (CN)

(73) Assignees: HEFEI XINSHENG OPTOELECTRONICS TECHNOLOGY CO., LTD, Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/641,339

(22) PCT Filed: Nov. 19, 2018

(86) PCT No.: PCT/CN2018/116239
§ 371 (c)(1),
(2) Date: Feb. 24, 2020

(87) PCT Pub. No.: WO2019/179146
PCT Pub. Date: Sep. 26, 2019

(65) Prior Publication Data
US 2020/0243660 A1    Jul. 30, 2020

(30) Foreign Application Priority Data
Mar. 22, 2018  (CN) .......................... 201810240087.8

(51) Int. Cl.
*H01L 21/00*  (2006.01)
*H01L 27/00*  (2006.01)
(Continued)

(52) U.S. Cl.
CPC .... *H01L 29/42384* (2013.01); *H01L 21/0274* (2013.01); *H01L 21/47573* (2013.01);
(Continued)

(58) Field of Classification Search
CPC ........... H01L 21/0274; H01L 21/47635; H01L 21/47573; H01L 27/1248; H01L 27/1288;
(Continued)

(56) References Cited

U.S. PATENT DOCUMENTS 5,414,283 A    5/1995  den Boer et al.
8,420,442 B2 * 4/2013  Takechi ............ H01L 21/02587
                                                         438/104
(Continued)

FOREIGN PATENT DOCUMENTS

CN    101656295 A    2/2010
CN    102709313 A    10/2012
(Continued)

OTHER PUBLICATIONS

International Search Report of PCT application No. PCT/CN2018/116239 dated Feb. 19, 2019.
(Continued)

*Primary Examiner* — Nikolay K Yushin
(74) *Attorney, Agent, or Firm* — Fay Sharpe LLP

(57) ABSTRACT

The present disclosure relates to a thin film transistor and a manufacturing method thereof, a flexible display screen and a display device. The thin film transistor is disposed on a substrate. The thin film transistor includes: an active layer, a source-drain conductive layer, and a gate conductive layer. The gate conductive layer includes a gate electrode, and the (Continued)

gate conductive layer is disposed on one side of the active layer away from the substrate and insulated from the active layer. The source-drain conductive layer includes a first electrode and a second electrode. The orthogonal projections of the first electrode, the gate electrode, and the second electrode on the substrate are sequentially nested from inside to outside and separately disposed. The reliability of image display may be improved.

19 Claims, 12 Drawing Sheets

(51) Int. Cl.
| | |
|---|---|
| *H01L 29/00* | (2006.01) |
| *H01L 29/423* | (2006.01) |
| *H01L 21/027* | (2006.01) |
| *H01L 21/4757* | (2006.01) |
| *H01L 21/4763* | (2006.01) |
| *H01L 27/12* | (2006.01) |
| *H01L 29/417* | (2006.01) |
| *H01L 29/66* | (2006.01) |
| *H01L 29/786* | (2006.01) |

(52) U.S. Cl.
CPC ...... *H01L 21/47635* (2013.01); *H01L 27/124* (2013.01); *H01L 27/1218* (2013.01); *H01L 27/1225* (2013.01); *H01L 27/1288* (2013.01); *H01L 29/41733* (2013.01); *H01L 29/66969* (2013.01); *H01L 29/7869* (2013.01)

(58) Field of Classification Search
CPC ............. H01L 27/1225; H01L 27/1218; H01L 27/124; H01L 29/41733; H01L 29/7869; H01L 29/66969; H01L 29/42384
See application file for complete search history.

(56) References Cited

U.S. PATENT DOCUMENTS

| | | | |
|---|---|---|---|
| 9,112,037 B2* | 8/2015 | Yamazaki | ........... H01L 27/1255 |
| 2006/0263576 A1 | 11/2006 | Hirose | |
| 2011/0097844 A1* | 4/2011 | Takechi | .............. H01L 29/4908 438/104 |
| 2013/0207101 A1* | 8/2013 | Yamazaki | ......... H01L 29/41733 257/43 |
| 2018/0342591 A1 | 11/2018 | Wen | |

FOREIGN PATENT DOCUMENTS

| | | |
|---|---|---|
| CN | 103365012 A | 10/2013 |
| CN | 104483793 A | 4/2015 |
| CN | 107104152 A | 8/2017 |
| CN | 108493236 A | 9/2018 |

OTHER PUBLICATIONS

First office action of Chinese application No. 201810240087.8 dated Apr. 25, 2019.

Second office action of Chinese application No. 201810240087.8 dated Jan. 8, 2020.

Junsheng Yu, et al; OLED Display Foundation and Industrialization, Feb. 28, 2015, pp. 67-68 with English translation related to claims 1-7.

Zhizhen Ye, et al; Physics and Technology of Semiconductor Thin Films, Dec. 31, 2014, p. 223 with English translation related to claims 1-7.

* cited by examiner

THIN FILM TRANSISTOR AND MANUFACTURING METHOD THEREOF AND DISPLAY DEVICE

CROSS-REFERENCE TO RELATED APPLICATION

This application is a 371 of PCT Application No. PCT/CN2018/116239 filed Nov. 19, 2018, which claims priority to Chinese Patent Application No. 201810240087.8, filed Mar. 22, 2018 and entitled "THIN FILM TRANSISTOR AND MANUFACTURING METHOD THEREOF, FLEXIBLE DISPLAY SCREEN AND DISPLAY DEVICE", the entire contents of which are incorporated herein by reference.

TECHNICAL FIELD

The present disclosure relates to a thin film transistor and a manufacturing method thereof, a flexible display screen and a display device.

BACKGROUND

With the development of display technologies, flexible display screens have gained more and more attention.

The current flexible display screen is usually an active display screen, and the pixels thereof are controlled by a thin film transistor (TFT). Such a TFT is usually disposed on a substrate, and the TFT is a rectangular TFT, that is, the orthogonal projections of a source electrode, a drain electrode, an active layer, and a gate electrode, which are included in the TFT, on the substrate are all rectangular.

SUMMARY

The embodiments of the present disclosure provide a thin film transistor and a manufacturing method thereof, a flexible display screen and a display device. The technical solutions are as follows:

In a first aspect, a thin film transistor is provided. The thin film transistor is disposed on a base substrate, and the thin film transistor includes: a semiconductor active layer, a source-drain electrode pattern, and a gate electrode pattern; the gate electrode pattern includes a gate electrode, the gate electrode pattern is disposed on one side of the semiconductor active layer away from the base substrate and is insulated from the semiconductor active layer, the source-drain electrode pattern includes a first electrode and a second electrode, the first electrode and the second electrode are respectively either a source electrode or a drain electrode, and the first electrode and the second electrode are both electrically connected to the semiconductor active layer; wherein the orthogonal projections of the first electrode, the gate electrode, and the second electrode on the base substrate present a first pattern, a first annular shape, and a second annular shape which are sequentially nested from inside to outside and separately disposed, the orthogonal projection of the semiconductor active layer on the base substrate presents either a circular shape or an annular shape, and the first pattern is either a circular shape and the annular shape.

Optionally, the thin film transistor further includes a gate insulating layer, wherein the semiconductor active layer is disposed on one side of the source-drain electrode pattern away from the base substrate; the gate insulating layer is disposed on one side of the semiconductor active layer away from the base substrate; and the gate electrode pattern is disposed on one side of the gate insulating layer away from the base substrate.

Optionally, the thin film transistor further includes: a first insulating layer disposed on one side of the gate electrode pattern away from the base substrate; the first insulating layer provided with a first via hole and a second via hole; and a conductive layer disposed on one side of the first insulating layer away from the base substrate, wherein the conductive layer includes: a first lead connected to the first electrode through the first via hole, and a gate electrode lead connected to the gate electrode through the second via hole, and the first lead is configured to be connected to the electrode layer of a display screen.

Optionally, the thin film transistor further includes: a second insulating layer and a gate insulating layer, wherein the gate insulating layer is disposed on one side of the semiconductor active layer away from the base substrate; the gate electrode pattern is disposed on one side of the gate insulating layer away from the base substrate; the second insulating layer is disposed on one side of the gate electrode pattern away from the base substrate; and the source-drain electrode pattern is disposed on one side of the second insulating layer away from the base substrate, the second insulating layer is provided with a third via hole, and the first electrode and the second electrode are both electrically connected to the semiconductor active layer through the third via hole.

Optionally, the thin film transistor further includes: a third insulating layer disposed on one side of the source-drain electrode pattern away from the base substrate, the third insulating layer provided with a fourth via hole and a fifth via hole; and a conductive layer disposed on one side of the third insulating layer away from the base substrate; wherein the second insulating layer is further provided with a sixth via hole, the conductive layer includes: a first lead and a gate electrode lead, wherein the first lead is connected to the first electrode through the fourth via hole, the gate electrode lead is connected to the gate electrode through the fifth via hole, and the first lead is configured to be connected to the electrode layer of a display screen.

Optionally, the orthogonal projection of the sixth via hole on the base substrate presents a third annular shape, and the source-drain electrode pattern further includes a conductive material filled in the sixth via hole; and the first lead is connected to the first electrode through the fourth via hole, and the gate electrode lead is connected to the gate electrode through the fifth via hole and the conductive material.

Optionally, a circle center of the first pattern, a circle center of the first annular shape, and a circle center of the second annular shape are coincided.

Optionally, a circle center of the first pattern, a circle center of the first annular shape, a circle center of the second annular shape, and a circle center of the third annular shape coincide.

In a second aspect, a flexible display screen is provided. The flexible display screen includes: a base substrate and a thin film transistor disposed on the base substrate, the thin film transistor being any one of the thin film transistors in the first aspect.

Optionally, the flexible display screen further includes: an electrode layer electrically connected to the first electrode; wherein the thin film transistor includes a conductive layer, and the electrode layer and the conductive layer are manufactured by adopting a single patterning process.

Optionally, the flexible display screen is a machine light-emitting diode display screen, and the electrode layer is either an anode layer or a cathode layer.

Optionally, the flexible display screen is a liquid crystal display screen, and the electrode layer is a pixel electrode layer.

In a third aspect, a display device is provided. The display device includes any one of flexible display screens in the second aspect.

In a fourth aspect, method of manufacturing a thin film transistor is provided. The method includes: forming a semiconductor active layer, a source-drain electrode pattern, and a gate electrode pattern on a base substrate; wherein the gate electrode pattern includes a gate electrode, the gate electrode pattern is disposed on one side of the semiconductor active layer away from the base substrate and insulated from the semiconductor active layer, the source-drain electrode pattern includes a first electrode and a second electrode, the first electrode and the second electrode are respectively either a source electrode or a drain electrode, and the first electrode and the second electrode are both electrically connected to the semiconductor active layer; wherein the orthogonal projections of the first electrode, the gate electrode, and the second electrode on the base substrate present a first pattern, a first annular shape, and a second annular shape which are sequentially nested from inside to outside and separately disposed, the orthogonal projection of the semiconductor active layer on the base substrate is either a circular shape or an annular shape, and the first pattern is either a circular shape or an annular shape.

Optionally, the thin film transistor further includes: a gate insulating layer, forming a semiconductor active layer, a source-drain electrode pattern, and a gate electrode pattern on one side of the base substrate away from the base substrate, includes: forming the source-drain electrode pattern on the base substrate; forming an active layer pattern on one side of the source-drain electrode pattern away from the base substrate; sequentially forming an insulating film layer and a gate electrode layer on one side of the active layer pattern away from the base substrate; exposing, developing, and etching the gate electrode layer coated with a photoresist to obtain the gate electrode pattern with the photoresist, and exposing part of the insulating film layer; etching the exposed part of the insulating film layer to obtain the patterned gate insulating layer, and exposing part of the active layer pattern; performing a metallization process on the exposed part of the active layer pattern to enable the active layer pattern to form the semiconductor active layer; and peeling off the photoresist.

Optionally, the method further includes: forming a first insulating layer on one side of the gate electrode pattern away from the base substrate, wherein the first insulating layer is provided with a first via hole and a second via hole thereon; and forming a conductive layer on one side of the first insulating layer away from the base substrate, wherein the conductive layer includes: a first lead connected to the first electrode through the first via hole, and a gate electrode lead connected to the gate electrode through the second via hole, and the first lead is configured to be connected to the electrode layer of a display screen.

Optionally, the thin film transistor further includes: a second insulating layer and a gate insulating layer, forming a semiconductor active layer, a source-drain electrode pattern, and a gate electrode pattern on one side of the base substrate away from the base substrate, includes: forming an active layer pattern on the base substrate; sequentially forming an insulating film layer and a gate electrode layer on one side of the active layer pattern away from the base substrate; exposing, developing, and etching the gate electrode layer coated with a photoresist to obtain the gate electrode pattern with the photoresist, and exposing part of the insulating film layer; etching the exposed part of the insulating film layer to obtain the patterned gate insulating layer, and exposing part of the active layer pattern; performing a metallization process on the exposed part of the active layer pattern to enable the active layer pattern to form the semiconductor active layer; peeling off the photoresist; forming the second insulating layer on one side of the gate electrode pattern away from the base substrate; and forming the source-drain electrode pattern on one side of the second insulating layer away from the base substrate, wherein the second insulating layer is provided with a third via hole, and the first electrode and the second electrode are both electrically connected to the semiconductor active layer through the third via hole.

Optionally, the second insulating layer is provided with a sixth via hole thereon; forming the source-drain electrode pattern on the second insulating layer, includes: forming the source-drain electrode pattern on one side of the second insulating layer on which the sixth via hole is formed away from the base substrate; and the method further includes: forming a third insulating layer on one side of the source-drain electrode pattern away from the base substrate, wherein the third insulating layer is provided with a fourth via hole and a fifth via hole; and forming a conductive layer on one side of the third insulating layer away from the base substrate, wherein the conductive layer includes: a first lead connected to the first electrode through the fourth via hole, and a gate electrode lead connected to the gate electrode through the five via hole and the sixth via hole, and the first lead is configured to be connected to the electrode layer of a display screen.

Optionally, an orthogonal projection of the sixth via hole on the base substrate presents a third annular shape, and the source-drain electrode pattern further includes a conductive material filled in the sixth via hole; and the gate electrode lead is connected to the gate electrode through the fifth via, hole and the conductive material.

Optionally, a circle center of the first pattern, a circle center of the first annular shape, and a circle center of the second annular shape coincide.

DETAILED DESCRIPTION

To clarify the objectives, the technical solutions, and the advantages of the present disclosure, the following will describe the present disclosure in further detail in conjunction with the accompanying drawings. Apparently, the described embodiments are merely a part of the embodiments of the present disclosure but not all of them. All other embodiments obtained by a person of ordinary skill in the art based on the embodiments of the present disclosure without creative efforts belong to the scope of the present disclosure.

The TFTs used in current flexible display screens are rectangular TFTs. When the flexible display screen is bent, a film layer of the rectangular TFT will be broken due to the applied tensile force. As the side direction of the minimum bounding rectangle of an orthogonal projection of the TFT on the substrate (such as the length direction or the width direction) and the bending direction are the same or different, the characteristics of the TFT may have at least two possible changes. First, when the length direction of the TFT of the minimum bounding rectangle is perpendicular to its bending direction, the channel region of the TFT (the region formed between a source electrode and a drain electrode when the TFT conducts electricity) will change (for example, a seam extension along the length direction may occur), but will not completely disconnected. Second, when the length direction of the TFT is the same as its bending direction, the channel region of the TFT may be partially broken or completely broken. It can be seen that when the rectangular TFT is in a bending state in different directions, the change of the characteristics of the TFT is relatively large, which results in the relatively large difference of the display effects of the final image displayed on the flexible display screen in different regions, thereby affecting the reliability of image display.

Figure 1:
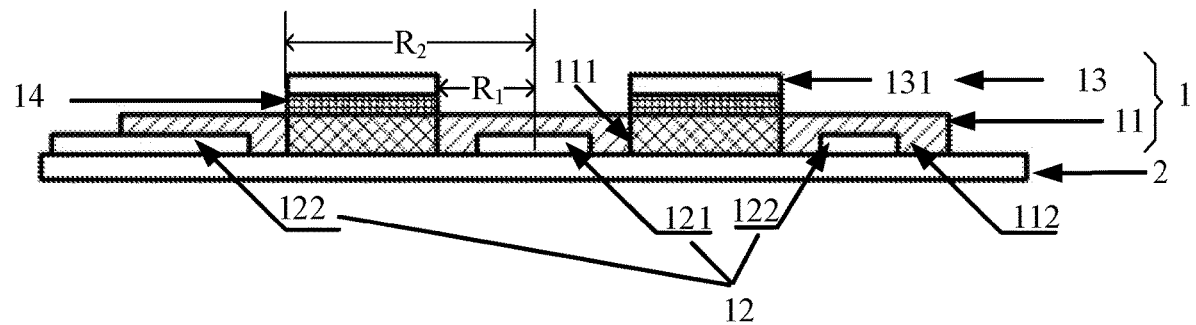
FIG. 1 to FIG. 8 are schematic structural diagrams of a TFT according to an embodiment of the present disclosure respectively.
Figure 2:
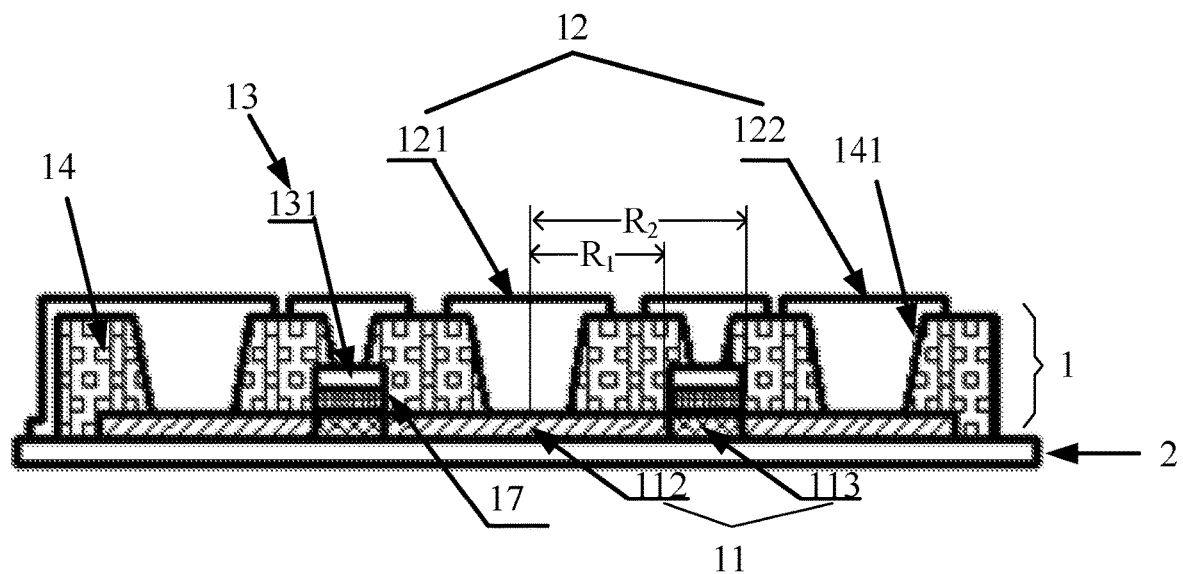

The embodiment of the present disclosure provides a TFT 1. The TFT 1 has multiple implementing manners. FIG. 1 and FIG. 2 are side views of two different schematic structures of the TFT 1. As shown in FIG. 1 and FIG. 2, the TFT 1 is disposed on a substrate 2, and the TFT 1 includes an active layer 11, a source-drain conductive layer 12, and a gate conductive layer 13.

The gate conductive layer 13 includes a gate electrode 13. The gate conductive layer 13 is disposed on one side of the active layer 11 away from the substrate 2, and insulated from the active layer 11. The source-drain conductive layer 12 includes a first electrode 121 and a second electrode 122. The first electrode 121 and the second electrode 122 are respectively either a source electrode or a drain electrode, and the first electrode 121 and the second electrode 122 in the source-drain conductive layer 12 are both electrically connected to the active layer 11. It should be noted that a first layer being disposed on one side of a second layer away from a third layer in the present disclosure intents to describe the formation sequence of the first layer, the second layer and the third layer, rather than the positional relationship.

It should be noted that the TFT 1 in the embodiment of the present disclosure may firstly form the gate conductive layer 13 and then form the source-drain conductive layer 12, or may firstly form the source-drain conductive layer 12 and then form the gate conductive layer 13. The corresponding structures of the TFT 1 are different due to the different sequence of forming the gate conductive layer and the source-drain conductive layer. For example, for the TFT 1 shown in FIG. 1, the source-drain conductive layer 12 is formed followed by the gate conductive layer 13. For the TFT 1 shown in FIG. 2, the gate conductive layer 13 is formed followed by the source-drain conductive layer 12.

Figure 3:
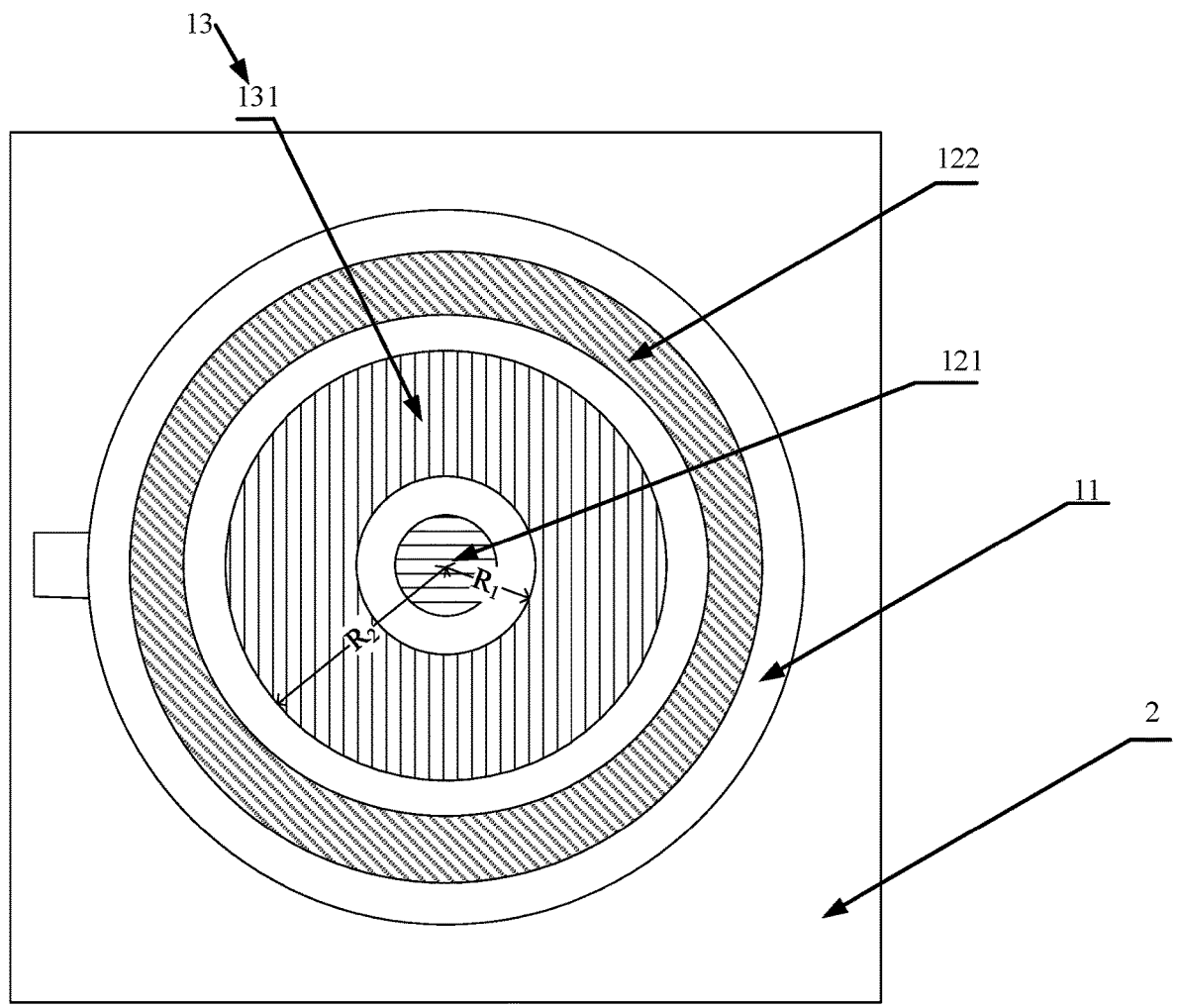
Figure 4:
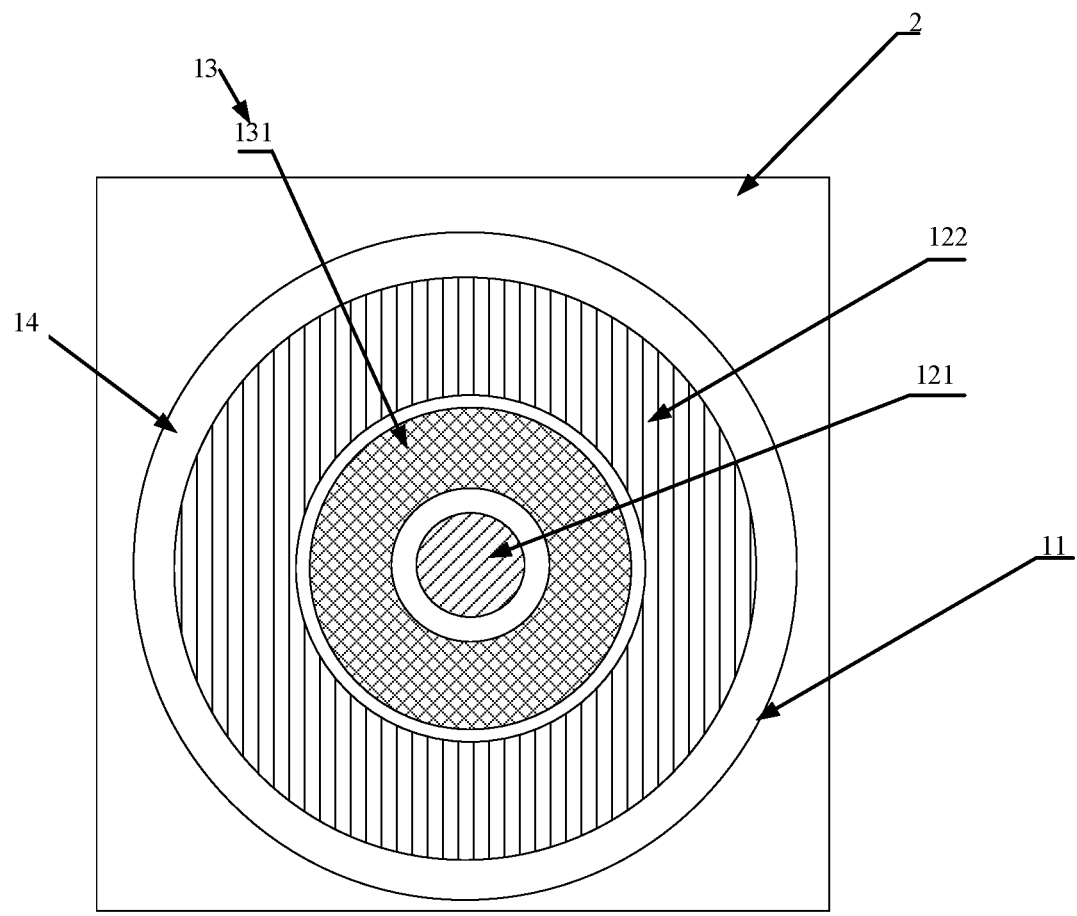

As an example, FIG. 3 is a top view of the TFT 1 shown in FIG. 1 and FIG. 4 is a top view of the TFT 1 shown in FIG. 2. As shown in FIG. 3 and FIG. 4, the orthogonal projections of the first electrode 121, the gate electrode 131, and the second electrode 122 on the substrate 2 are sequentially nested from inside to outside and separately disposed. And, the orthogonal projection of the semiconductor active layer 11 on the base substrate 2 presents either a circular shape or an annular shape, and the first pattern is either a circular shape or an annular shape.

In summary, according to the TFT provided by the embodiment of the present disclosure, the orthogonal projections of the first electrode, the gate electrode, and the second electrode on the substrate present the first pattern, the first annular shape, and the second annular shape which are sequentially nested from inside to outside and separately disposed, and the orthogonal projection of the active layer on the substrate presents either a circular shape or an annular shape. Therefore, when the TFT is in a bending state in different directions, the change of the characteristics of the TFT is relatively small, and the difference of the final image displayed on the flexible display screen is reduced, thereby improving the reliability of image display.

Further, since the TFT adopts a top gate structural design, the orthogonal projections of the gate electrode and the source electrode on the substrate do not overlap and the orthogonal projections of the gate electrode and the drain electrode on the substrate do not overlap, thereby effectively reducing the generation of parasitic capacitance and further improving the controllability of the TFT.

Since FIG. 1 and FIG. 2 show the TFTs 1 with two different structures, the TFTs 1 with two structures are further described below in two implementing manners respectively.

In the first optional implementing manner, as shown in FIG. 1, the TFT 1 further includes: a gate insulating layer 14. The active layer 11 is disposed on one side of the source-drain conductive layer 12 away from the substrate 2. The gate insulating layer 14 is disposed on one side of the active layer 11 away from the substrate 2. The gate conductive layer 13 is disposed on one side of the gate insulating layer 14 away from the substrate 2.

Figure 5:
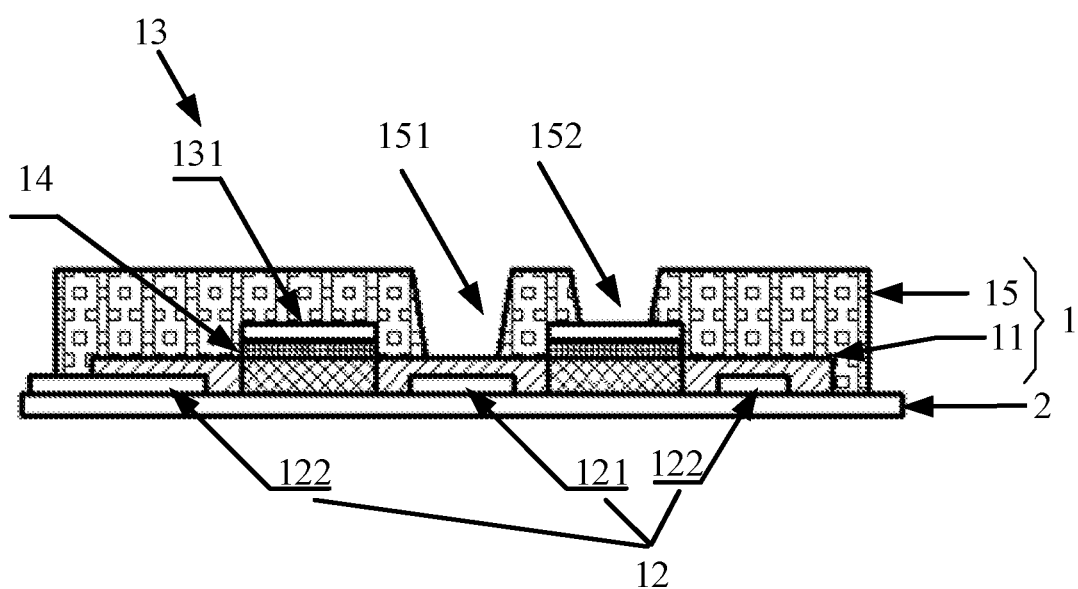

As shown in FIG. 5, on the basis of the TFT 1 shown in FIG. 1, the TFT 1 further includes: a first insulating layer 15 disposed on one side of the gate conductive layer 13 away from the substrate 2 and the first insulating layer 15 is provided with a first via hole 151 and a second via hole 152.

Figure 6:
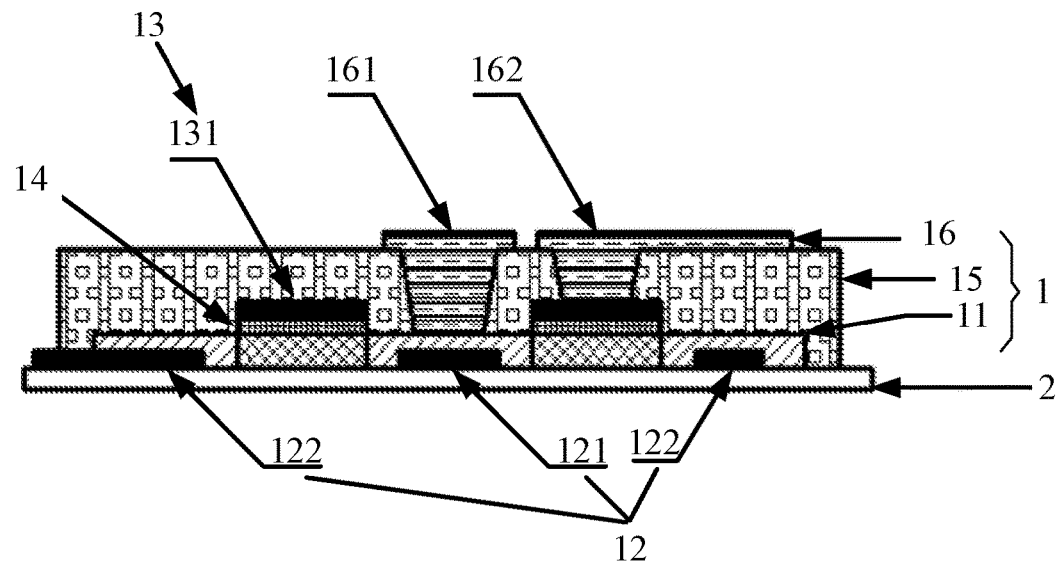

As shown in FIG. 6, on the basis of the TFT 1 shown in FIG. 5, the TFT 1 further includes: a conductive layer 16 disposed on one side of the first insulating layer 15 away from the substrate 2, and the conductive layer 16 includes: a first lead 161 connected to the first electrode 121 through the first via hole 151, and a gate electrode lead 162 connected to the gate electrode 131 through the second via hole 152. In the embodiment of the present disclosure, the first electrode 121 needs to be connected to the first lead 161 through the active layer 11 and the first via hole 151. The first lead 161 is configured to be connected to the electrode layer of a display screen to realize on-off control over the current of the electrode layer by the TFT. When the display screen is an organic light-emitting diode (OLED) display screen, the electrode layer may be an anode layer or a cathode layer. When the display screen is a liquid crystal display (LCD) display screen, the electrode layer may be a pixel electrode layer.

In the second optional implementing manner, as shown in FIG. 2, the TFT 1 includes a gate insulating layer 17 and a second insulating layer 14. The gate insulating layer 17 is disposed on one side of the active layer 11 away from the substrate 2. The gate conductive layer 13 is disposed on one side of the gate insulating layer 17 away from the substrate 2. The second insulating layer 14 is disposed on one side of the gate conductive layer 13 away from the substrate 2. The source-drain conductive layer 12 is disposed on one side of the second insulating layer 14 away from the substrate 2. A third via hole 141 is disposed on the second insulating layer 14. The source-drain conductive layer 12 is electrically connected to the active layer 11 through the third via hole 141.

Figure 7:
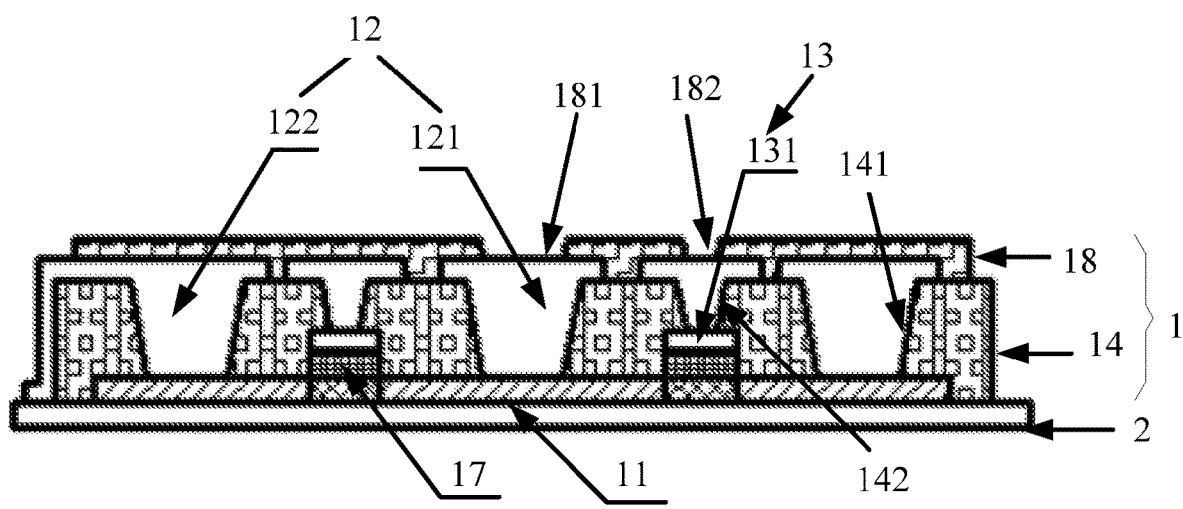

Further, as shown in FIG. 7, on the basis of the TFT 1 shown in FIG. 2, the TFT 1 further includes: a third insulating layer 18 disposed on one side of the source-drain conductive layer 12 away from the substrate 2, and a fourth via hole 181 and a fifth via hole 182 are disposed on the third insulating layer 18.

Figure 8:
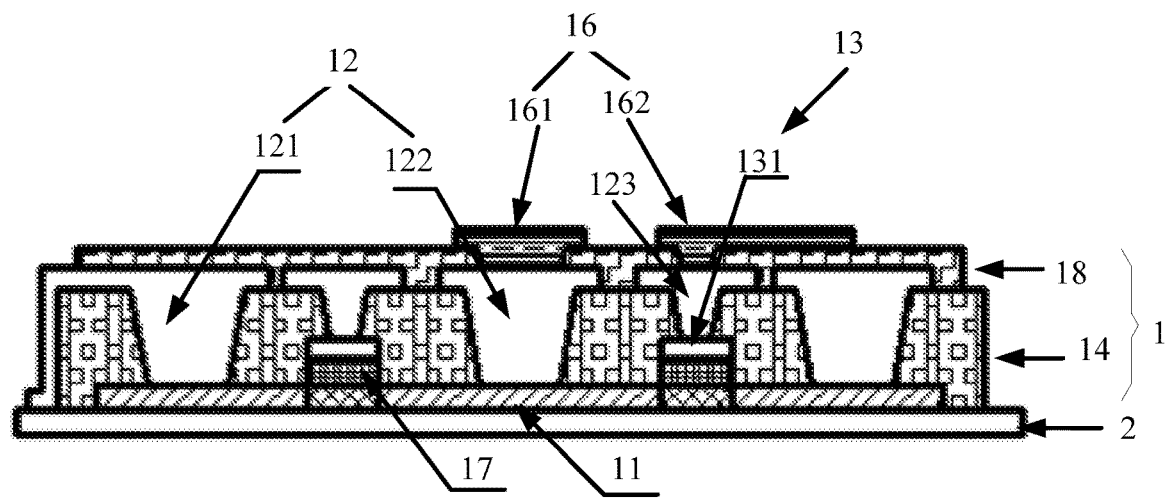

The second insulating layer 14 is further provided with a sixth via hole 142. As shown in FIG. 8, on the basis of the TFT 1 shown in FIG. 7, the TFT 1 further includes a conductive layer 16. The conductive layer 16 includes: a first lead 161 and a gate electrode lead 162. The first lead 161 is connected to the first electrode 121 through the fourth via hole 181. The gate electrode lead 162 is connected to the gate electrode 131 through the fifth via hole 182 and the sixth via hole 142, and the first lead 161 is configured to be connected to the electrode layer of the display screen. When the display screen is an OLED display screen, the electrode layer may be either an anode layer or a cathode layer. When the display screen is a LCD display screen, the electrode layer may be a pixel electrode layer.

During actual implementation of the embodiment of the present disclosure, the gate electrode lead 162 may be directly connected to the gate electrode 131 through the fifth via hole 182. However, it may cause the segment gap on the conductive layer 16 to be too large and the requirements of a manufacturing process for the conductive layer 16 to be too high. Therefore, furthermore, as shown in FIG. 8, the source-drain conductive layer 12 further includes a conductive material 123 filled in the sixth via hole 142. The gate electrode lead 162 is connected to the gate electrode 131 through the fifth via hole 182 and the conductive material 123, thereby reducing the segment gap on the conductive layer 16 and lowering the requirements of the manufacturing process for the conductive layer 16.

Optionally, the orthogonal projection of the sixth via hole 142 on the substrate 2 presents a third annular shape. The orthogonal projection of the first annular shape corresponding to the gate electrode on the substrate is in the orthogonal projection of the third annular shape on the substrate. In this way, the orthogonal projection of the conductive material filled in the sixth via hole 142 on the substrate 2 also presents a third annular shape. Therefore, when the TFT is in a bending state in different directions, the change of the characteristics of the TFT is relatively small, and the difference of the final image displayed on the flexible display screen is reduced, thereby improving the reliability of image display.

The TFT 1 provided by the embodiment of the present disclosure may be referred to a circular TFT (or an annular TFT), and all the circular and annular structures may be concentric, for example, the circle centers of the first pattern, the first annular shape, the second annular shape, and the circle center corresponding to the active layer are all concentric. The circular TFT has multiple advantages, and the principle of the generation of the advantages is introduced as follows by the embodiments of the present disclosure.

In a first aspect, the output resistance of the circular TFT provided by the embodiment of the present disclosure is infinitely large and the output current is constant.

The output current IDS of the TFT in a saturation region is unrelated to the size of the source-drain electrode voltage VDS, and the output resistance of the TFT is infinitely large at this point. Therefore, the stable output current may be obtained by utilizing the current characteristics of the TFT in the saturation region. However, the size of the IDS is related to the width-to-length ratio W/L of the TFT, wherein W is the width of the TFT and L is the length of the TFT.

For the rectangular TFT in the related art, when the size of L changes, the output current IDS of the TFT gradually increases, and the output resistance of the TFT is not infinitely large at this point, which causes the output current IDS to be unstable and more difficult to control accurately.

However, for the circular TFT provided by the embodiment of the present disclosure, the width-to-length ratio W/L of the width W and the length L of the circular TFT meets:

$$\frac{W}{L} = \frac{2\pi}{\ln\left(\frac{R_2}{R_1}\right)}.$$

Referring to FIG. 1 to FIG. 3, R2 is the outer diameter of an annular channel diagram, and R1 is the inner diameter of the annular channel region. In the embodiment of the present disclosure, the width-to-length ratio W/L may be 16/7 to 7/6.

When the channel of the TFT is pinched off, the width W and the length L simultaneously change in the same proportion, and the final result is that the value of the width-to-length ratio W/L, remains unchanged, that is, when the drain electrode potential is raised, the output current IDS remains unchanged. That is, the circular TFT has an infinitely large output resistance and more stable current output.

In a second aspect, the characteristic of the circular TFT provided by the embodiment of the present disclosure has strong stability in a bending state.

In the embodiment of the present disclosure, assuming that the second annular shape corresponds to the drain electrode, then on the one hand, the drain electrode needs to consume more electrons than an inner ring electrode (or the conventional rectangular electrode) does, so under the same bias voltage condition of the drain electrode, the circular TFT in the saturation state has less channel charge than the rectangular TFT does. Therefore, few electrons are trapped due to the self-heating stress effect (abbreviation SHS), and the change of a threshold voltage Vth is small. On the other hand, the mechanical bending strain causes an atomic distance in the active layer to increase, thereby effectively reducing the splitting energy level (i.e., ΔE) of the bonding and anti-bonding orbitals between atoms. The reason is that the Fermi function value will change when more electrons are excited onto the anti-bonding orbitals of a semiconductor, while the enhancement of the channel conductivity appears as a negative drift (i.e., negative direction drift) of the threshold voltage Vth in the TFT transfer characteristics.

Figure 9:
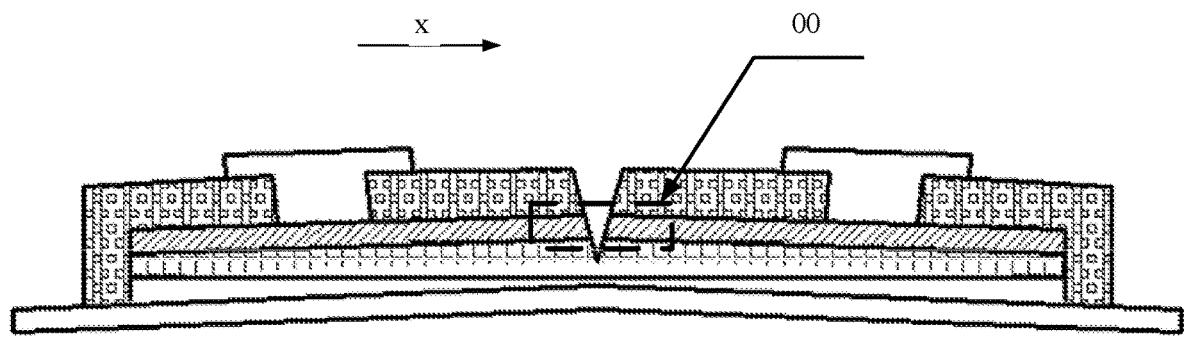
FIG. 9 is a schematic diagram of a channel region of a rectangular TFT when the length direction of the rectangular TFT is the same as its bending direction provided by the related art.

FIG. 9 is a schematic diagram of a channel region of the rectangular TFT when the length direction of the rectangular TFT is the same as the bending direction in the related art. As shown in FIG. 9, when the length direction x of the rectangular TFT is the same as the bending direction, the channel region 00 of the TFT may manifest partially or completely broken. When the length direction x of the TFT is perpendicular to the bending direction, the channel region of the TFT will change, but will not be completely broken. Therefore, when the rectangular TFT is in the bending state in different directions, the change of the TFT characteristics is relatively large.

Figure 10:
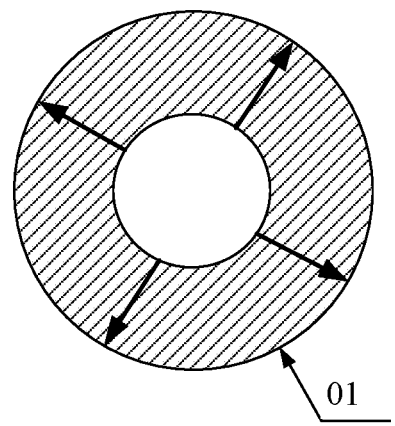
FIG. 10 to FIG. 12 are schematic diagrams of a channel region of a circular TFT according to an embodiment of the present disclosure respectively.
Figure 11:
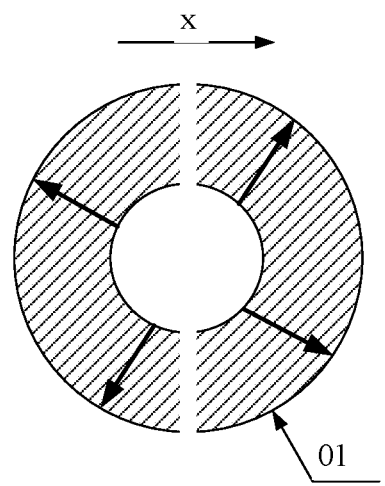
Figure 12:
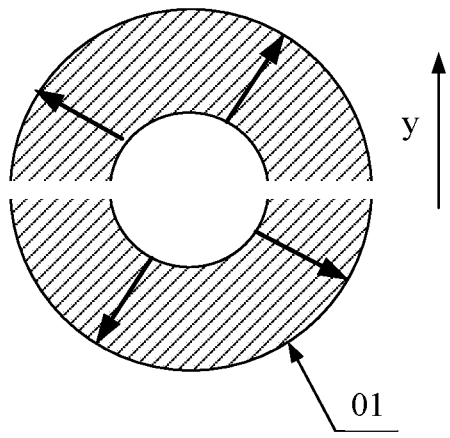

As shown in FIG. 10 to FIG. 12, FIG. 10 to FIG. 12 are schematic diagrams of a channel region of a circular TFT according to the embodiment of the present disclosure. FIG. 10 is the schematic diagram when the channel region of the circular TFT is not in the bending state according to the embodiment of the present disclosure. FIG. 11 and FIG. 12 are the schematic diagrams when the channel region of the circular TFT is in the bending state according to the embodiment of the present disclosure. The oblique line region in FIG. 10 to FIG. 12 is the channel region 01 For the circular TFT provided by the embodiment of the present disclosure, when the TFT is not bent, the state of the channel region 01 thereof is as shown in FIG. 10, and the current can flow from inside to outside in respective directions of the annular channel region. When the channel region cracks due to the bending of the TFT, no matter whether the bending direction thereof is the left-right direction, that is, the x direction shown in FIG. 11, or the bending direction thereof is the up-down direction, that is, the y direction shown in FIG. 12, the channel region 01 is only affected to a small extent, and the path through which the current can be transmitted is relatively well preserved. Therefore, the circular TFT has better bending resistance.

Therefore, the circular TFT is not limited by the bending direction and shows excellent stability in mechanical bending strain.

In a third aspect, the parasitic capacitance of the circular TFT provided by the embodiment of the present disclosure is small.

As shown in FIG. 1 or FIG. 2, the orthogonal projections of the first electrode, the gate electrode, and the second electrode on the substrate are nested and separately disposed, that is, the orthogonal projections of the source electrode, the drain electrode, and the gate electrode on the substrate do not overlap, thereby effectively reducing the generation of the parasitic capacitance and improving the controllability of the TFT.

In summary, according to the TFT provided by the embodiment of the present disclosure, the orthogonal projections of the first electrode, the gate electrode, and the second electrode on the substrate present the first pattern, the first annular shape, and the second annular shape which are sequentially nested from inside to outside and separately disposed, and the orthogonal projection of the active layer on the substrate is either a circular shape or a annular shape. Therefore, when the TFT is in a bending state in different directions, the change of the characteristics of the TFT is relatively small, and the difference of the final image displayed by the flexible display screen is reduced, thereby improving the reliability of image display. Moreover, the output resistance is infinitely large, the output current is constant, and the characteristic stability of the TFT is strong in the bending state. The orthogonal projections of the source electrode, the drain electrode, and the gate electrode on the substrate do not overlap, thereby effectively reducing the generation of the parasitic capacitance and improving the controllability of the TFT.

The embodiment of the present disclosure provides a flexible display screen, which includes: a substrate and a TFT disposed on the substrate, wherein the TFT is the TFT 1 provided in the above embodiment of the present disclosure.

Further, the array substrate further includes: an electrode layer electrically connected to the first electrode. As shown in FIG. 6 and FIG. 8, the TFT 1 includes a conductive layer 16, and the electrode layer and the conductive layer are produced by adopting a single patterning process. When the flexible display screen is an OLED display screen, the electrode layer may be an anode layer or a cathode layer.

In summary, according to the flexible display screen provided by the embodiment of the present disclosure, the orthogonal projections of the first electrode, the gate electrode, and the second electrode on the substrate present the first pattern, the first annular shape, and the second annular shape which are sequentially nested from inside to outside and separately disposed, and the orthogonal projection of the active layer on the substrate is either a circular shape or a annular shape. Therefore, when the TFT is in a bending state in different directions, the change of the characteristics of the TFT is relatively small, and the difference of the final image displayed on the flexible display screen is reduced, thereby improving the reliability of image display. Moreover, the output resistance is infinitely large, the output current is constant, and the characteristic stability of the TFT is strong in the bending state. The orthogonal projections of the source electrode, the drain electrode, and the gate electrode on the substrate do not overlap, thereby effectively reducing the generation of the parasitic capacitance, improving the controllability of the TFT and further ensuring the display stability of the flexible display screen.

The embodiment of the present disclosure provides a display device, which includes the flexible display screen provided by the embodiment of the present disclosure. During the actual implementation, the display device provided by the embodiment of the present disclosure may be any product or component having a display function, such as a mobile phone, a tablet computer, a television, a display, a notebook computer, a digital photo frame, or a navigator.

The embodiment of the present disclosure provides a method of manufacturing a TFT and the method includes: forming an active layer, a source-drain conductive layer, and a gate conductive layer on a substrate.

The gate conductive layer includes a gate electrode, and the gate conductive layer is disposed on one side of the active layer away from the substrate, and is insulated from the active layer. The source-drain conductive layer includes a first electrode and a second electrode. The first electrode and the second electrode are respectively either a source electrode or a drain electrode, and the first electrode and the second electrode are both electrically connected to the active layer.

The orthogonal projections of the first electrode, the gate electrode, and the second electrode on the substrate present a first pattern, a first annular shape, and a second annular shape which are sequentially nested from inside to outside and separately disposed, the orthogonal projection of the active layer on the substrate is either a circular shape or an annular shape, and the first pattern is either a circular shape or an annular shape.

In summary, according to the method for a TFT provided by the embodiment of the present disclosure, the orthogonal projections of the first electrode, the gate electrode, and the second electrode on the substrate are the first pattern, the first annular shape, and the second annular shape which are sequentially nested from inside to outside and separately disposed, and the orthogonal projection of the active layer on the substrate is either a circular shape or an annular shape. Therefore, when the TFT is in a bending state in different directions, the change of the characteristics of the TFT is relatively small, and the difference of the final image displayed on the flexible display screen is reduced, thereby improving the reliability of image display. Moreover, the output resistance is infinitely large, the output current is constant, and the characteristic stability of the TFT is strong in the bending state. The orthogonal projections of the source electrode, the drain electrode and the gate electrode on the substrate do not overlap, thereby effectively reducing the generation of the parasitic capacitance and improving the controllability of the TFT.

Further, since the TFT adopts a top gate structural design, the orthogonal projections of the gate electrode and the source electrode and the drain electrode on the substrate do not overlap, thereby effectively reducing the generation of parasitic capacitance, and further improving the controllability of the TFT.

In the embodiment of the present disclosure, the TFT may have a plurality of structures, and correspondingly, the manufacturing method thereof is also different. The embodiment of the present disclosure provides the implementing manners of the following two manufacturing methods.

Figure 13:
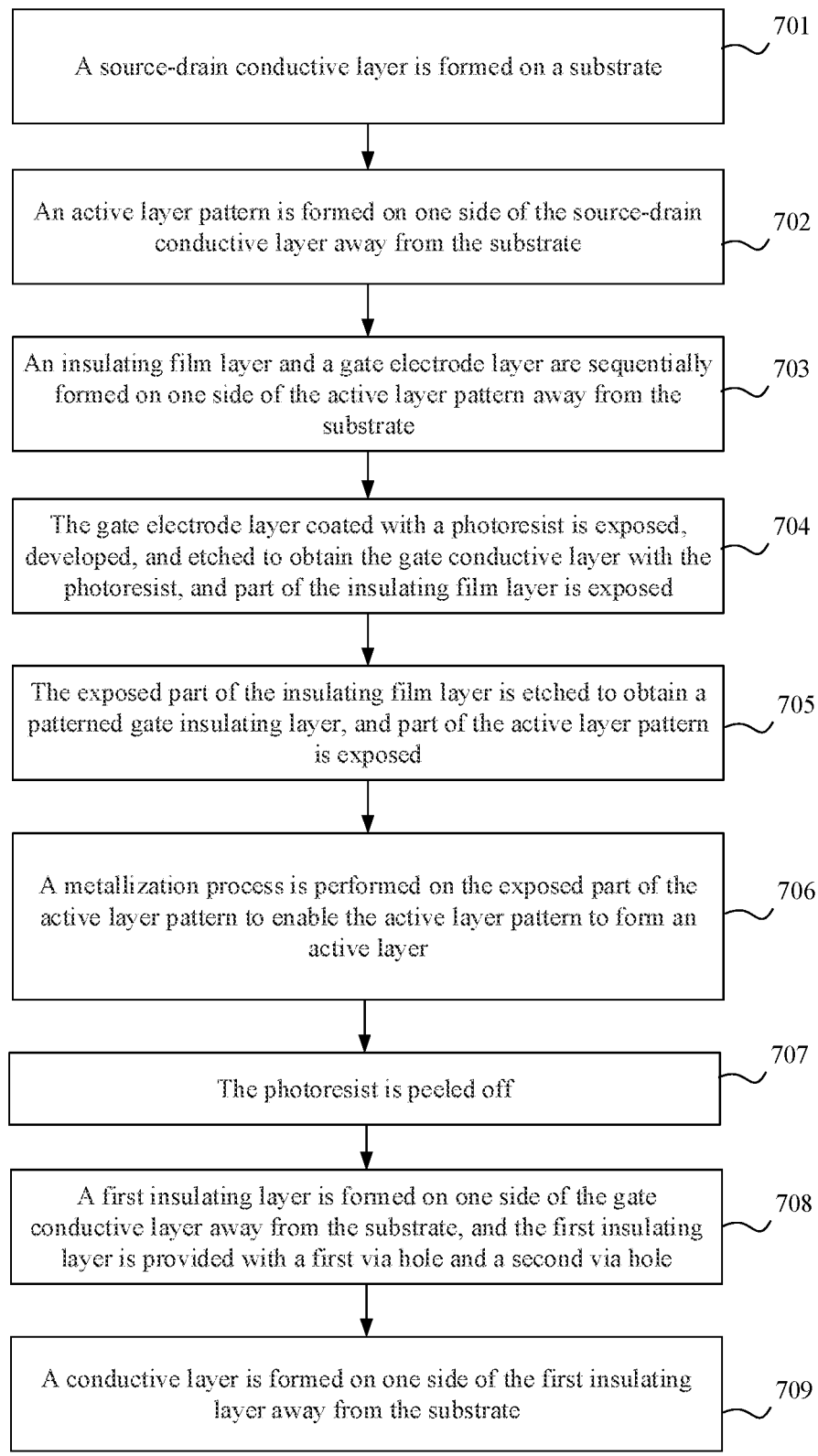
FIG. 13 is a schematic flowchart of a method of manufacturing a TFT according to an embodiment of the present disclosure.

In the first implementing manner, the structure of the TFT may be as shown in FIG. 6. As shown in FIG. 13, the method of manufacturing a TFT includes the following steps.

In step 701, a source-drain conductive layer is formed on a substrate.

Figure 14:
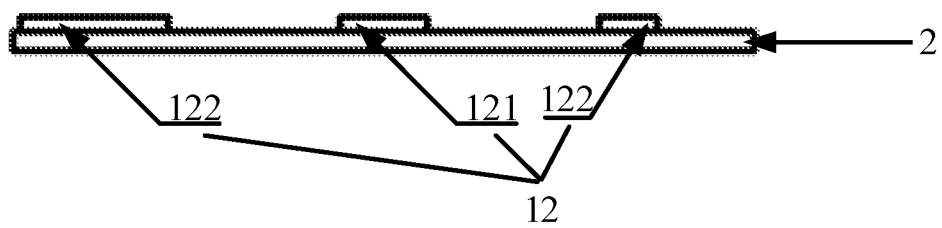
FIG. 14 to FIG. 17 are partial schematic structural diagrams of a TFT in the process of a method of manufacturing a TFT according to an embodiment of the present disclosure respectively.
Figure 15:
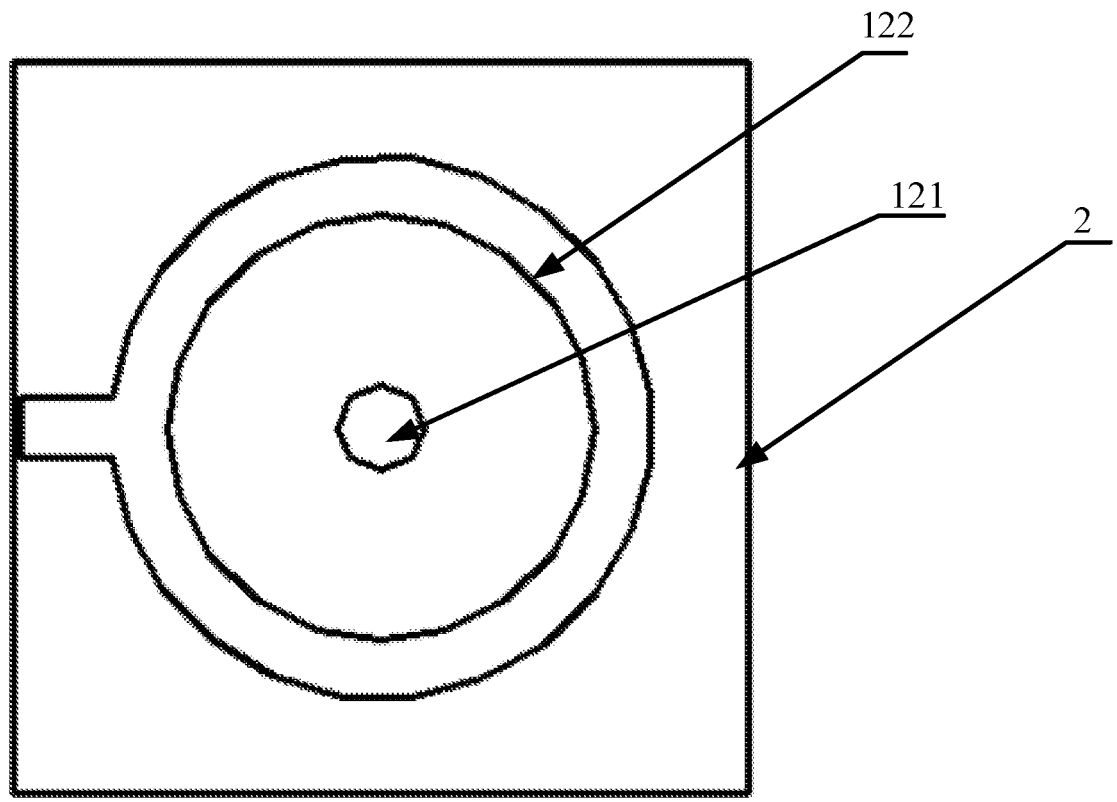

The source-drain conductive layer may be made of a metal material. For example, the source-drain conductive layer is made of molybdenum (Mo), Copper (Cu), Aluminum (Al), or an alloy (such as MoTi alloy or MoNb alloy). The thickness of the source-drain conductive layer may be determined according to specific implementing conditions. For example, when the material of the source-drain conductive layer is Cu, the thickness thereof may be 550 nm. Optionally, the substrate may be a transparent substrate such as a glass substrate. For example, a metal layer having a certain thickness may be deposited on the substrate by adopting the methods such as coating, magnetron sputtering, thermal evaporation, or plasma enhanced chemical vapor deposition (PECVD). Then, the single patterning process is performed on the metal layer to form the source-drain conductive layer. The substrate 2 on which the source-drain conductive layer 12 is disposed may be as shown in FIG. 14 and FIG. 15, wherein FIG. 14 is a side view of the substrate and FIG. 15 is a top view of the substrate. The source-drain conductive layer 12 includes a first electrode 121 and a second electrode 122. The first electrode 121 and the second electrode 122 are respectively either a source or a drain electrode. The orthogonal projections of the first electrode 121, the gate electrode 131, and the second electrode 122 on the substrate 2 are a first pattern, a first annular shape, and a second annular shape which are sequentially nested from inside to outside and separately disposed, and the first pattern is either a circular shape or an annular shape.

In step 702, an active layer pattern is formed on one side of the source-drain conductive layer away from the substrate.

Figure 16:
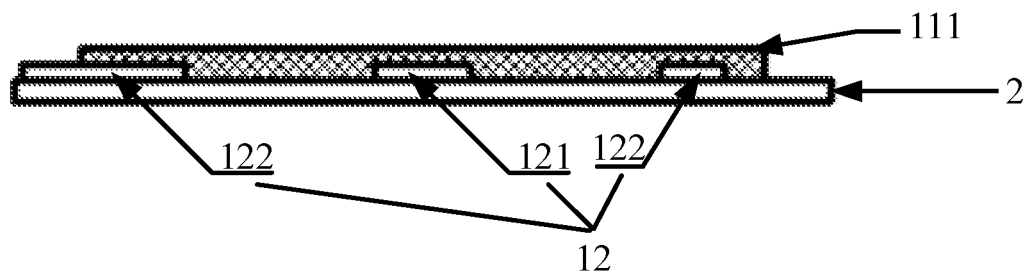
Figure 17:
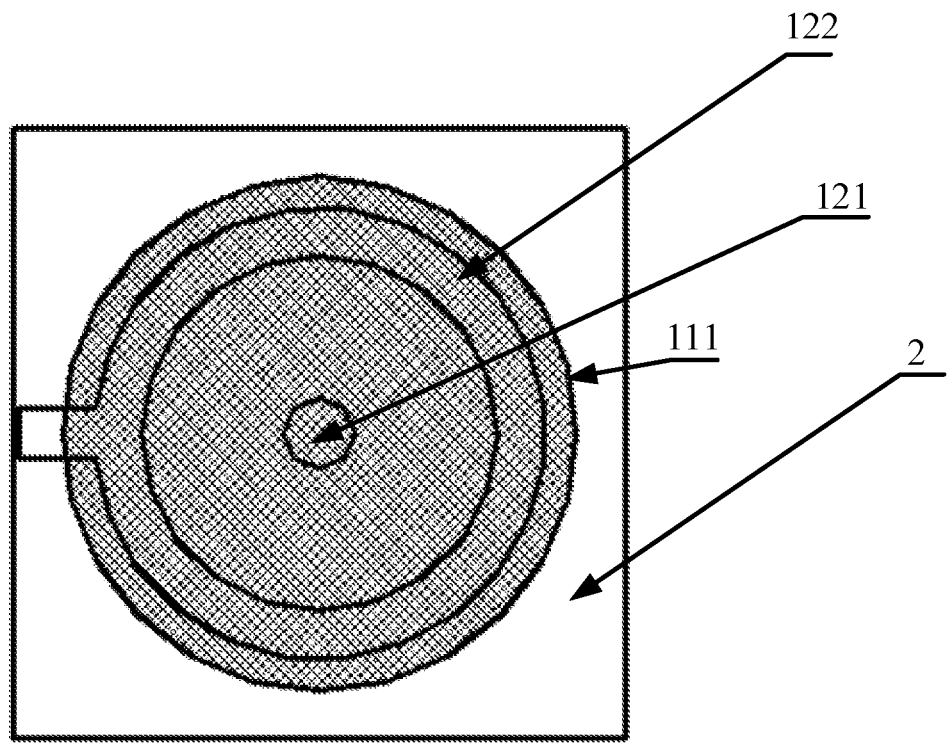

For example, an active film layer having a certain thickness may be deposited on one side of the source-drain conductive layer away from the substrate by adopting the methods such as coating, magnetron sputtering, thermal evaporation, or PECV. Then the single patterning process is performed on the active film layer to form the active layer pattern. The substrate 2 provided with the active layer pattern 111 may be as shown in FIGS. 16 and 17. FIG. 16 is a side view of the substrate, and FIG. 17 is a top view of the substrate.

In step 703, an insulating film layer and a gate electrode layer are sequentially formed on one side of the active layer pattern away from the substrate.

Exemplarily, the insulating film layer and the gate electrode layer may be sequentially formed on one side of the active layer pattern away from the substrate by the method such as coating, magnetron sputtering, thermal evaporation, or PECVD.

In step 704, the gate electrode layer coated with a photoresist is exposed, developed, and etched to obtain the gate conductive layer with the photoresist, and part of the insulating film layer is exposed.

For example, the photoresist may be coated on the gate electrode layer, and then the gate electrode layer coated with the photoresist is exposed, developed, and etched by using a mask to obtain the gate conductive layer with the photoresist. Part of the insulating film layer is exposed. The developed photoresist and the etched gate conductive layer have the same shape, and are both the first annular shape.

The gate conductive layer may be made of a metal material. For example, the gate conductive layer is made of molybdenum (Mo), copper (Cu), aluminum (Al), or an alloy (such as MoTi alloy or MoNb alloy). The thickness of the gate conductive layer may be determined according to specific implementing conditions. For example, when the material of the gate conductive layer is Cu, the thickness may be 450 nm.

In step 705, the exposed part of the insulating film layer is etched to obtain a patterned gate insulating layer, and part of the active layer pattern is exposed.

The patterned gate insulating layer and the gate conductive layer have the same shape and both are the second annular shape. Optionally, the insulating layer may have a thickness of 150 nm.

In step 706, a metallization process is performed on the exposed part of the active layer pattern to enable the active layer pattern to form an active layer.

The metallization process is also referred to as an ion implantation process. In the embodiment of the present disclosure, the exposed part of the active layer pattern is subjected to the ion implantation. The exposed part of the active layer pattern forms a metallized active layer, the unexposed part is a non-metallized active layer, and the two eventually form the active layer.

For the ion implantation process, in order to enable donor or acceptor impurity atoms to enter the crystal, the implanted impurity atoms are ionized into ions and are accelerated with a strong electric field, so that these ions obtain high kinetic energy, and then bombard the crystal directly so as to "squeeze" into the crystal. When adopting the ion implantation process, many lattice defects may be generated in the crystal, and some atoms may also reside in the gaps of the lattice defects. Therefore, after the ion implantation, the crystal needs to be annealed to eliminate the generated defects and "activate" the impurities which have entered the crystal.

Optionally, the material of the active layer may be indium gallium zinc oxide (IGZO), indium tin oxide (ITO), or indium-doped zinc oxide (IZO), etc. The thickness of the active layer may be about 40 nm (nanometer). The orthogonal projection of the active layer on the substrate presents either a circular shape or an annular shape.

In step 707, the photoresist is peeled off.

After the photoresist is peeled off, the substrate 2 provided with the gate insulating layer 14 and the gate conductive layer 13 may be as shown in FIG. 1 and FIG. 3, wherein 112 is a metallized active layer and 113 is a non-metallized active layer.

In step 708, a first insulating layer is formed on one side of the gate conductive layer away from the substrate, and the first insulating layer is provided with a first via hole and a second via hole.

Exemplarily, an insulating film layer may be formed on one side of the gate conductive layer away from the substrate by adopting the methods such as coating, magnetron sputtering, thermal evaporation, or PECVD. The single patterning process is performed on the insulating film layer to form the first insulating layer provided with the first via hole and the second via hole. Optionally, the thickness of the insulating layer may be 300 nm. The substrate 2 provided with the first insulating layer 15 may be as shown in FIG. 5.

In step 709, a conductive layer is formed on one side of the first insulating layer away from the substrate. The conductive layer includes: a first lead connected to the first electrode through the first via hole, and a gate electrode lead connected to the gate electrode through the second via hole. The first lead is configured to be connected to the electrode layer.

Optionally, the conductive layer may be made of metal or indium tin oxide (ITO). Exemplarily, a metal layer may be formed on one side of the first insulating layer away from the substrate by adopting the methods such as coating, magnetron sputtering, thermal evaporation, or PECVD. Then the single patterning process is performed on the metal layer to form the conductive layer. The substrate 2 provided with the conductive layer may be as shown in FIG. 6. The structure obtained at this point is the TFT.

Figure 18:
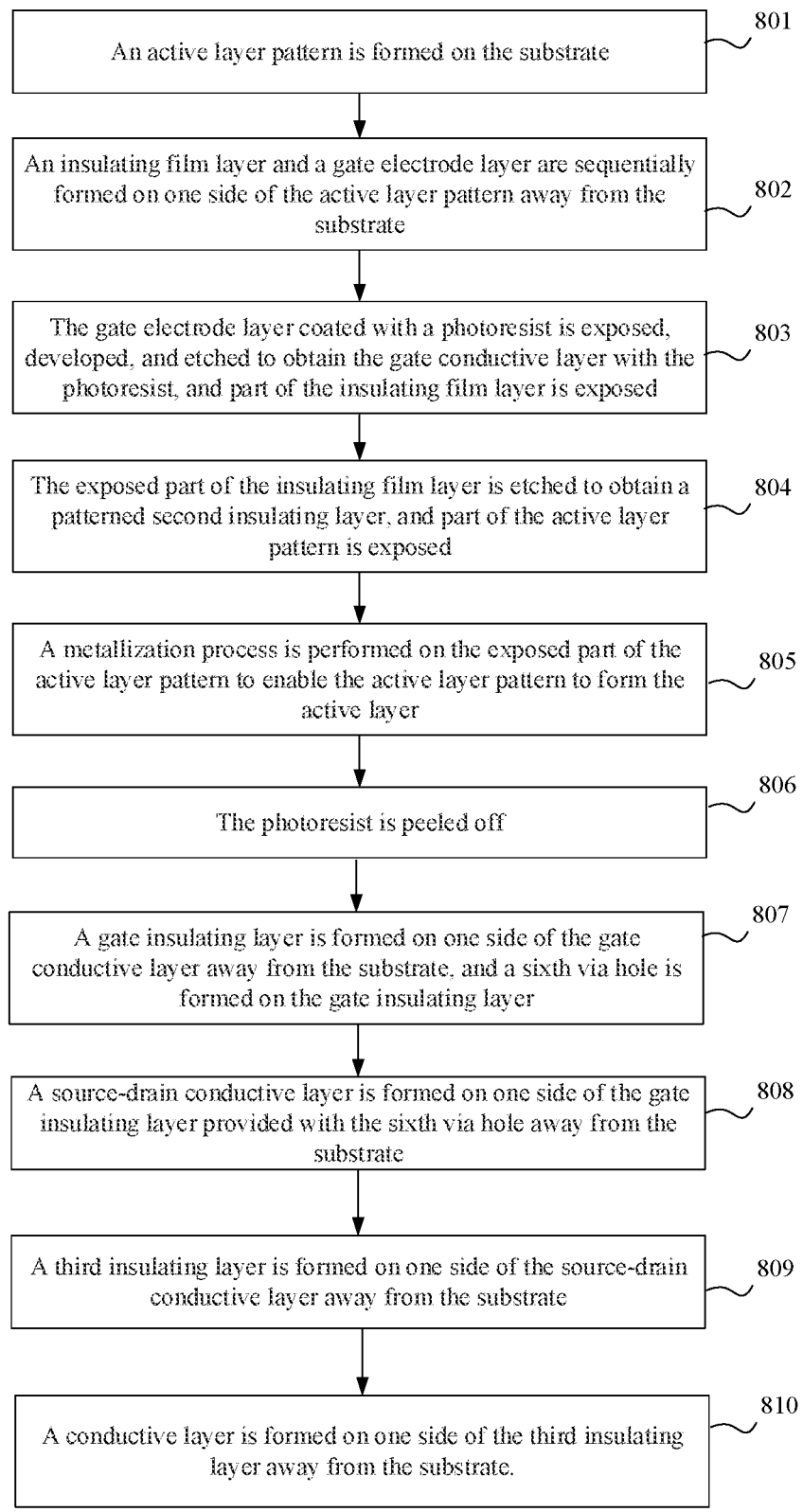
FIG. 18 is a schematic flowchart of another method of manufacturing a TFT according to an embodiment of the present disclosure.

In the second implementing manner, the structure of the TFT may be as shown in FIG. 8. As shown in FIG. 18, the method of manufacturing a TFT includes the following steps.

In step 801, an active layer pattern is formed on the substrate.

Figure 19:
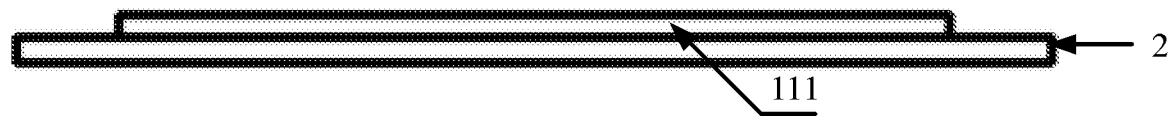
FIG. 19 to FIG. 22 are partial structural diagrams of a TFT in the process of a method of manufacturing a TFT according to an embodiment of the present disclosure respectively.
Figure 20:
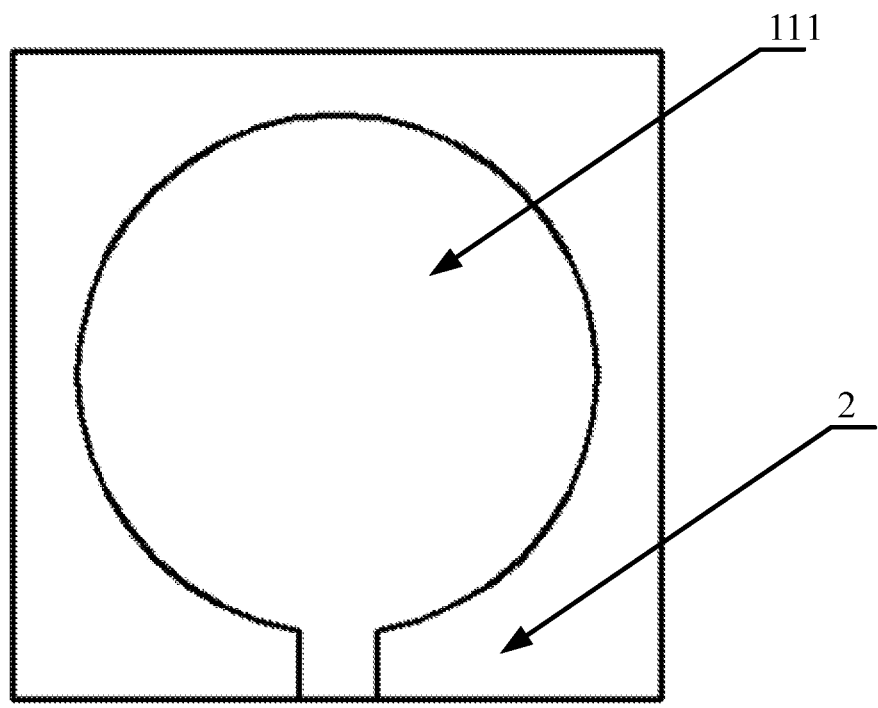

For example, an active film layer having a certain thickness may be deposited on the substrate by adopting the methods such as coating, magnetron sputtering, thermal evaporation, or PECVD. Then the single patterning process is performed on the active film layer to form the active layer pattern. The substrate 2 provided with the active layer pattern 111 may be as shown in FIGS. 19 and 20. FIG. 19 is a side view of the substrate, and FIG. 20 is a top view of the substrate.

In step 802, an insulating film layer and a gate electrode layer are sequentially formed on one side of the active layer pattern away from the substrate.

In step 803, the gate electrode layer coated with a photoresist is exposed, developed, and etched to obtain the gate conductive layer with the photoresist, and part of the insulating film layer is exposed.

In step 804, the exposed part of the insulating film layer is etched to obtain a patterned gate insulating layer, and part of the active layer pattern is exposed.

In step 805, a metallization process is performed on the exposed part of the active layer pattern to enable the active layer pattern to form the active layer.

In step 806, the photoresist is peeled off.

The above steps 802 to 806 may refer to steps 703 to 707, which are not repeated in detail herein.

In step 807, a second insulating layer is formed on one side of the gate conductive layer away from the substrate, and a sixth via hole is formed on the second insulating layer.

Figure 21:
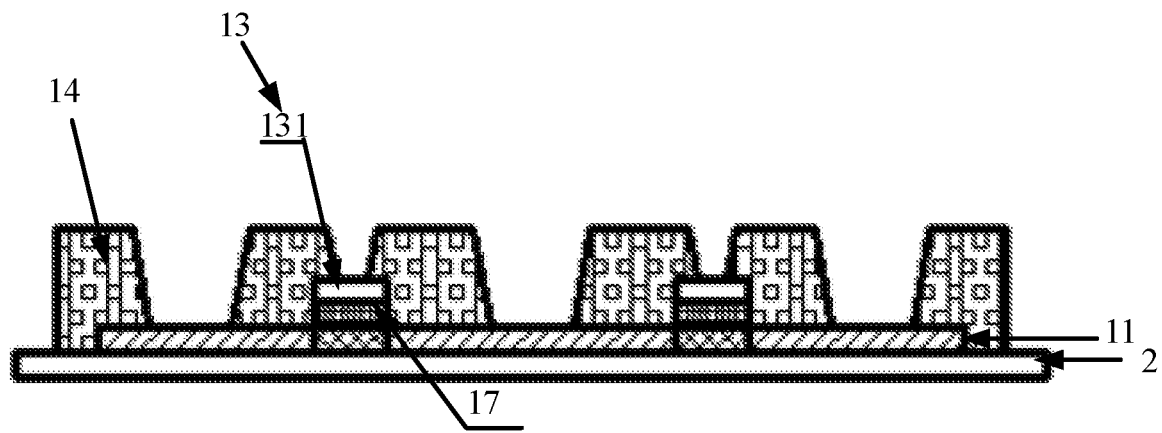
Figure 22:
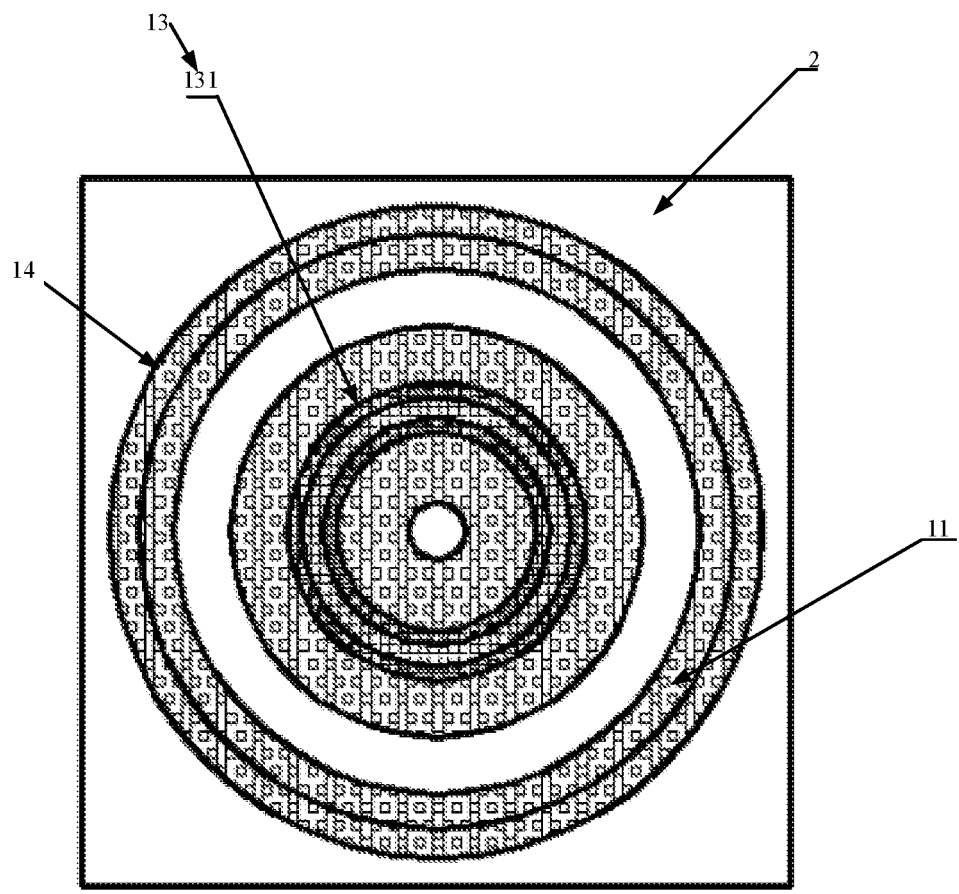

Exemplarily, an insulating film layer may be formed on one side of the gate conductive layer away from the substrate by adopting the methods such as coating, magnetron sputtering, thermal evaporation, or PECVD. Then the single patterning process is performed on the insulating film layer to form the second insulating layer provided with the sixth via hole. The substrate 2 provided with the gate insulating layer 17, the gate conductive layer 13, and the second insulating layer 14 may be as shown in FIG. 21 and FIG. 22. FIG. 21 is a side view of the substrate, and FIG. 22 is a top view of the substrate, wherein 112 is a metallized active layer and 113 is a non-metallized active layer.

In step 808, a source-drain conductive layer is formed on one side of the second insulating layer provided with the sixth via hole away from the substrate. A third via hole is disposed on the second insulating layer, and the source-drain conductive layer is electrically connected to the active layer through the third via hole.

Exemplarily, the source-drain conductive layer may be made of a metal material. A metal layer having a certain thickness may be deposited on one side of the second insulating layer away from the substrate by adopting the methods such as coating, magnetron sputtering, thermal evaporation, or PECVD. Then the single patterning process is performed on the metal layer to form the source-drain conductive layer. The substrate 2 on which the source-drain conductive layer 12 is disposed may be as shown in FIG. 2 and FIG. 4.

In step 809, a third insulating layer is formed on one side of the source-drain conductive layer away from the substrate. A fourth via hole and a fifth via hole are disposed in the third insulating layer.

Exemplarily, an insulating film layer may be formed on one side of the source-drain conductive layer away from the substrate by adopting the methods such as coating, magnetron sputtering, thermal evaporation, or PECVD. Then the single patterning process is performed on the insulating film layer to form the third insulating layer with the fourth via hole and the fifth via hole. The substrate 2 provided with the third insulating layer 18 may be as shown in FIG. 7.

In step 810, a conductive layer is formed on one side of the third insulating layer away from the substrate. The conductive layer includes: a first lead connected to the first electrode through the fourth via hole, and a gate electrode lead connected to the gate electrode through the fifth via hole and the sixth via hole. The first lead is configured to be connected to the electrode layer of a display screen.

Optionally, the conductive layer may be made of metal or indium tin oxide (ITO), and its thickness may be 100 nm. For example, a metal layer may be formed on one side of the third insulating layer away from the substrate by adopting the methods such as coating, magnetron sputtering, thermal evaporation, or PECVD. Then the single patterning process is performed on the metal layer to form the conductive layer. Exemplarily, the substrate 2 provided with the conductive layer 16 may be as shown in FIG. 8.

In the embodiment of the present disclosure, as shown in FIG. 8, the gate electrode lead 162 may be directly connected to the gate electrode 131 through the fifth via hole 182 (not shown in FIG. 8). However, it may cause the segment gap on the conductive layer 16 to be too large, and the requirements of a manufacturing process for the conductive layer 16 to be too high. Therefore, in step 805, the source-drain conductive layer further includes a conductive material filled in the sixth via hole. In this way, the gate electrode lead can be connected to the gate electrode through the fifth via hole and the conductive material, thereby reducing the segment gap on the conductive layer 16 and lowering the requirements of the manufacturing process for the conductive layer 16.

Optionally, the orthogonal projection of the sixth via hole on the substrate presents a third annular shape.

In summary, according to the TFT provided by the embodiment of the present disclosure, the orthogonal projections of the first electrode, the gate electrode, and the second electrode on the substrate present the first pattern, the first annular shape, and the second annular shape which are sequentially nested from inside to outside and separately disposed, and the orthogonal projection of the active layer on the substrate presents either a circular shape or an annular shape. Therefore, when the TFT is in a bending state in different directions, the change of the characteristics of the TFT is relatively small, and the difference of the final image displayed on the flexible display screen is reduced, thereby improving the reliability of image display. Moreover, the output resistance is infinitely large, the output current is constant, and the characteristic stability of the TFT is strong in the bending state. The orthogonal projections of the source electrode, the drain electrode, and the gate electrode on the substrate do not overlap, thereby effectively reducing the generation of the parasitic capacitance and improving the controllability of the TFT.

Regarding the method in the above embodiment, the specific manner in which the operation is performed has been described in detail in the device-related embodiment, and will not be explained in detail herein.

Other embodiments of the present disclosure will be apparent to those skilled in the art from consideration of the specification and practice of the present disclosure. This application is intended to cover any variations, uses, or adaptations of the present disclosure following the general principles thereof and including common knowledge or commonly used technical measures which are not disclosed herein. The specification and embodiments are to be considered as exemplary only, with a true scope and spirit of the present disclosure is indicated by the following claims.

It will be appreciated that the present disclosure is not limited to the exact construction that has been described above and illustrated in the accompanying drawings, and that various modifications and changes may be made without departing from the scope thereof. It is intended that the scope of the present disclosure only be limited by the appended claims.

What is claimed is:

1. A method of manufacturing a thin film transistor, comprising:
   forming an active layer, a source-drain conductive layer, and a gate conductive layer on one side of the substrate away from the substrate, comprises:
     forming the source-drain conductive layer on the substrate;
     forming an active layer pattern on one side of the source-drain conductive layer away from the substrate;
     sequentially forming an insulating film layer and a gate electrode layer on one side of the active layer pattern away from the substrate;
     exposing, developing, and etching the gate electrode layer coated with a photoresist to obtain a gate conductive layer with the photoresist, and exposing part of the insulating film layer;
     etching the exposed part of the insulating film layer to obtain the patterned gate insulating layer, and exposing part of the active layer pattern;
     performing a metallization process on the exposed part of the active layer pattern to enable the active layer pattern to form the active layer; and
     peeling off the photoresist; wherein
   the gate conductive layer comprises a gate electrode, the gate conductive layer is disposed on one side of the active layer away from the substrate and insulated from the active layer, the source-drain conductive layer comprises a first electrode and a second electrode, the first electrode and the second electrode are respectively either a source electrode or a drain electrode, and the first electrode and the second electrode are both electrically connected to the active layer;
   wherein an orthogonal projection of the first electrode on the substrate is surrounded by an orthogonal projection of the gate electrode on the substrate, the orthogonal projection of the gate electrode on the substrate is surrounded by an orthogonal projection of the second electrode on the substrate, and any two of the orthogonal projection of the first electrode on the substrate, the orthogonal projection of the gate electrode on the substrate and the orthogonal projection of the second electrode on the substrate are separated from each other.

2. A thin film transistor, wherein the thin film transistor is disposed on a substrate, and comprises:
   an active layer, a source-drain conductive layer, and a gate conductive layer;
   wherein the gate conductive layer comprises a gate electrode, the gate conductive layer is disposed on one side of the active layer away from the substrate and is insulated from the active layer, the source-drain conductive layer comprises a first electrode and a second electrode, the first electrode and the second electrode are one of a source electrode and a drain electrode, respectively, and the first electrode and the second electrode are electrically connected to the active layer, respectively;
   wherein an orthogonal projection of the first electrode on the substrate is surrounded by an orthogonal projection of the gate electrode on the substrate, the orthogonal projection of the gate electrode on the substrate is surrounded by an orthogonal projection of the second electrode on the substrate, and any two of the orthogonal projection of the first electrode on the substrate, the orthogonal projection of the gate electrode on the substrate and the orthogonal projection of the second electrode on the substrate are separated from each other;
   wherein the thin film transistor further comprises: a gate insulating layer, a first insulating layer and a conductive layer; wherein
   the active layer is disposed on one side of the source-drain conductive layer away from the substrate;
   the gate insulating layer is disposed on one side of the active layer away from the substrate;
   the gate conductive layer is disposed on one side of the gate insulating layer away from the substrate;
   the first insulating layer is disposed on one side of the gate conductive layer away from the substrate; the first insulating layer provided with a first via hole and a second via hole; and
   the conductive layer is disposed on one side of the first insulating layer away from the substrate, wherein the conductive layer comprises: a first lead connected to the first electrode through the first via hole, and a gate electrode lead connected to the gate electrode through the second via hole, and the first lead is configured to be connected to an electrode layer of a display screen.

3. The thin film transistor according to claim 2, wherein the source-drain conductive layer is disposed on one side of the active layer away from the substrate.

4. The thin film transistor according to claim 2, wherein the orthogonal projections of the first electrode, the gate electrode, and the second electrode on the substrate present a first pattern, a first annular shape, and a second annular shape which are sequentially nested from inside to outside and separately disposed, the orthogonal projection of the active layer on the base substrate presents either a circular shape or an annular shape, and the first pattern is either a circular shape or an annular shape.

5. The thin film transistor according to claim 4, wherein
a circle center of the first pattern, a circle center of the first annular shape, and a circle center of the second annular shape are coincided.

6. A display device, comprising a substrate and a thin film transistor as defined in claim 2 disposed on the substrate.

7. The display device according to claim 6, wherein the source-drain conductive layer is disposed on one side of the active layer away from the substrate.

8. The display device according to claim 6, wherein the orthogonal projections of the first electrode, the gate electrode, and the second electrode on the substrate present a first pattern, a first annular shape, and a second annular shape which are sequentially nested from inside to outside and separately disposed, the orthogonal projection of the active layer on the base substrate presents either a circular shape or an annular shape, and the first pattern is either a circular shape or an annular shape.

9. The display device according to claim 8, wherein
a circle center of the first pattern, a circle center of the first annular shape, and a circle center of the second annular shape are coincided.

10. A thin film transistor, wherein the thin film transistor is disposed on a substrate, and comprises:
an active layer, a source-drain conductive layer, and a gate conductive layer;
wherein the gate conductive layer comprises a gate electrode, the gate conductive layer is disposed on one side of the active layer away from the substrate and is insulated from the active layer, the source-drain conductive layer comprises a first electrode and a second electrode, the first electrode and the second electrode are one of a source electrode and a drain electrode, respectively, and the first electrode and the second electrode are electrically connected to the active layer, respectively;
wherein an orthogonal projection of the first electrode on the substrate is surrounded by an orthogonal projection of the gate electrode on the substrate, the orthogonal projection of the gate electrode on the substrate is surrounded by an orthogonal projection of the second electrode on the substrate, and any two of the orthogonal projection of the first electrode on the substrate, the orthogonal projection of the gate electrode on the substrate and the orthogonal projection of the second electrode on the substrate are separated from each other;
wherein the thin film transistor further comprises: a second insulating layer, a gate insulating layer, a third insulating layer and a conductive layer; wherein
the gate insulating layer is disposed on one side of the active layer away from the substrate;
the gate conductive layer is disposed on one side of the gate insulating layer away from the substrate;
the second insulating layer is disposed on one side of the gate conductive layer away from the substrate;
the source-drain conductive layer is disposed on one side of the second insulating layer away from the substrate, the second insulating layer is provided with a third via hole, and the first electrode and the second electrode are both electrically connected to the active layer through the third via hole;
the third insulating layer is disposed on one side of the source-drain conductive layer away from the substrate, the third insulating layer provided with a fourth via hole and a fifth via hole; and
the conductive layer is disposed on one side of the third insulating layer away from the substrate; and
wherein the second insulating layer is further provided with a sixth via hole, the source-drain conductive layer further comprises a conductive material filled in the sixth via hole, and the conductive layer comprises: a first lead and a gate electrode lead, wherein the first lead is connected to the first electrode through the fourth via hole, the gate electrode lead is connected to the gate electrode through the fifth via hole and the sixth via hole, and the first lead is configured to be connected to an electrode layer of a display screen.

11. The thin film transistor according to claim 10, wherein the orthogonal projection of the sixth via hole on the substrate presents a third annular shape.

12. The thin film transistor according to claim 10, wherein the source-drain conductive layer is disposed on one side of the active layer away from the substrate.

13. The thin film transistor according to claim 10, wherein the orthogonal projections of the first electrode, the gate electrode, and the second electrode on the substrate present a first pattern, a first annular shape, and a second annular shape which are sequentially nested from inside to outside and separately disposed, the orthogonal projection of the active layer on the base substrate presents either a circular shape or an annular shape, and the first pattern is either a circular shape or an annular shape.

14. The thin film transistor according to claim 13, wherein
a circle center of the first pattern, a circle center of the first annular shape, and a circle center of the second annular shape are coincided.

15. A display device, comprising a substrate and a thin film transistor as defined in claim 10 disposed on the substrate.

16. The display device according to claim 15, wherein
the orthogonal projection of the sixth via hole on the substrate presents a third annular shape.

17. The display device according to claim 15, wherein the source-drain conductive layer is disposed on one side of the active layer away from the substrate.

18. The display device according to claim 15, wherein the orthogonal projections of the first electrode, the gate electrode, and the second electrode on the substrate present a first pattern, a first annular shape, and a second annular shape which are sequentially nested from inside to outside and separately disposed, the orthogonal projection of the active layer on the base substrate presents either a circular shape or an annular shape, and the first pattern is either a circular shape or an annular shape.

19. The display device according to claim 18, wherein a circle center of the first pattern, a circle center of the first annular shape, and a circle center of the second annular shape are coincided.

* * * * *